US010663991B2

(12) United States Patent
Sondur et al.

(10) Patent No.: US 10,663,991 B2
(45) Date of Patent: *May 26, 2020

(54) DETERMINING PARAMETERS OF AIR-COOLING MECHANISMS

(71) Applicant: Oracle International Corporation, Redwood Shores, CA (US)

(72) Inventors: Sanjeev Sondur, Horsham, PA (US); Eric Tran-Le, Santa Barbara, CA (US); Kenneth Gross, Escondido, CA (US); Kalyan Vaidyanathan, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/115,406

(22) Filed: Aug. 28, 2018

(65) Prior Publication Data

US 2018/0373276 A1    Dec. 27, 2018

Related U.S. Application Data

(63) Continuation of application No. 14/939,205, filed on Nov. 12, 2015, now Pat. No. 10,101,049.

(51) Int. Cl.
*G05D 23/19* (2006.01)
*H05K 7/20* (2006.01)
(Continued)

(52) U.S. Cl.
CPC .......... *G05D 23/1917* (2013.01); *F24F 11/30* (2018.01); *F24F 11/62* (2018.01);
(Continued)

(58) Field of Classification Search
CPC ...... G05D 23/1917; F24F 11/30; F24F 11/62; F24F 11/63; F24F 2120/20; F24F 2110/10; G06F 1/206; H05K 7/20836; Y02D 10/16
See application file for complete search history.

(56) References Cited

U.S. PATENT DOCUMENTS 3,162,808 A    12/1964 Haase
3,488,862 A    1/1970 Eckhart, Jr.
(Continued)

FOREIGN PATENT DOCUMENTS

EP    0729234 A1    8/1996
EP    0789292 A2    8/1997
(Continued)

OTHER PUBLICATIONS

Sandoz et al., 'Performance Improvement of a Binary Quantized All-Digitral Phase-Locked Loop with a New Aided-Acquisition Technique', Dec. 1984, IEEE Publication, vol. Com-32, No. 12, pp. 1269-1276.
(Continued)

*Primary Examiner* — Charles R Kasenge
(74) *Attorney, Agent, or Firm* — Invoke

(57) ABSTRACT

A method for determining parameters for one or more air-cooling mechanisms for a computer system. A current operating temperature of a system component within a particular system is determined. A maximum operating temperature of the system component is obtained. A difference value between the maximum operating temperature and the current operating temperature is computed. A parameter of an air-cooling mechanism of an environment, which includes the system component, is selected and modified based on the difference value between the maximum operating temperature and the current operating temperature.

19 Claims, 6 Drawing Sheets

(51) Int. Cl.
    *G06F 1/20*           (2006.01)
    *F24F 11/30*         (2018.01)
    *F24F 11/62*         (2018.01)
    *F24F 11/63*         (2018.01)
    *F24F 120/20*       (2018.01)
    *F24F 110/10*       (2018.01)

(52) U.S. Cl.
    CPC ......... *G06F 1/206* (2013.01); *H05K 7/20836* (2013.01); *F24F 11/63* (2018.01); *F24F 2110/10* (2018.01); *F24F 2120/20* (2018.01); *Y02D 10/16* (2018.01)

(56) References Cited

U.S. PATENT DOCUMENTS

| | | |
|---|---|---|
| 3,925,643 A | 12/1975 | Roantree et al. |
| 4,831,382 A | 5/1989 | Debus et al. |
| 4,937,763 A | 6/1990 | Mott |
| 5,014,229 A | 5/1991 | McEachern |
| 5,062,152 A | 10/1991 | Faulkner |
| 5,218,486 A | 6/1993 | Wilkinson |
| 5,241,383 A | 8/1993 | Chen et al. |
| 5,250,907 A | 10/1993 | Fukui |
| 5,359,663 A | 10/1994 | Katz |
| 5,383,137 A | 1/1995 | Burch |
| 5,448,239 A | 9/1995 | Blumberg et al. |
| 5,493,297 A | 2/1996 | Nguyen et al. |
| 5,557,557 A | 9/1996 | Frantz et al. |
| 5,574,674 A | 11/1996 | Pan |
| 5,587,711 A | 12/1996 | Williams et al. |
| 5,748,314 A | 5/1998 | Kitayoshi |
| 5,754,435 A | 5/1998 | Sato |
| 5,764,509 A | 6/1998 | Gross et al. |
| 5,784,297 A | 7/1998 | O'Brien et al. |
| 5,838,579 A | 11/1998 | Olson et al. |
| 5,841,377 A | 11/1998 | Takamizawa et al. |
| 5,903,476 A | 5/1999 | Mauskar et al. |
| 5,917,738 A | 6/1999 | Pan |
| 5,949,689 A | 9/1999 | Olson et al. |
| 6,002,878 A | 12/1999 | Gehman et al. |
| 6,019,496 A | 2/2000 | Rao et al. |
| 6,029,199 A | 2/2000 | Allen et al. |
| 6,072,496 A | 6/2000 | Guenter et al. |
| 6,147,501 A | 11/2000 | Chodora |
| 6,349,385 B1 | 2/2002 | Kaminski et al. |
| 6,377,840 B1 | 4/2002 | Gritsenko et al. |
| 6,427,141 B1 | 7/2002 | Barnhill |
| 6,430,522 B1 | 8/2002 | O'Brien et al. |
| 6,480,815 B1 | 11/2002 | Olson et al. |
| 6,594,605 B2 | 7/2003 | Kurosawa |
| 6,668,088 B1 | 12/2003 | Werner et al. |
| 6,876,943 B2 | 4/2005 | Wegerich |
| 6,898,469 B2 | 5/2005 | Bickford |
| 6,917,839 B2 | 7/2005 | Bickford |
| 6,917,845 B2 | 7/2005 | Hsiung et al. |
| 6,961,862 B2 | 11/2005 | Best et al. |
| 7,020,802 B2 | 3/2006 | Gross et al. |
| 7,023,581 B2 | 4/2006 | Soler et al. |
| 7,085,675 B2 | 8/2006 | Wegerich |
| 7,245,099 B2 | 7/2007 | Yamamoto et al. |
| 7,275,380 B2 * | 10/2007 | Durant .................... G06F 1/206 236/DIG. 9 |
| 7,280,988 B2 | 10/2007 | Helsper et al. |
| 7,386,417 B1 | 6/2008 | Bao et al. |
| 7,725,848 B2 | 5/2010 | Nebel et al. |
| 7,756,652 B2 | 7/2010 | Lewis et al. |
| 7,788,516 B2 | 8/2010 | Conroy et al. |
| 7,802,120 B2 | 9/2010 | Conroy et al. |
| 7,809,046 B2 | 10/2010 | Mujtaba et al. |
| 8,332,679 B2 | 12/2012 | Conroy et al. |
| 8,606,428 B2 * | 12/2013 | Chan .................. H05K 7/20518 700/300 |
| 8,662,943 B2 | 3/2014 | Conroy et al. |
| 9,158,310 B2 * | 10/2015 | Geissler ............. G05D 23/1932 |
| 9,188,996 B2 * | 11/2015 | Vaidyanathan .... G05D 23/1931 |
| 9,379,420 B2 | 6/2016 | Ketkar et al. |
| 9,587,874 B2 | 3/2017 | Kodama |
| 10,101,049 B2 * | 10/2018 | Sondur .................... F24F 11/30 |
| 2003/0055607 A1 | 3/2003 | Wegerich et al. |
| 2003/0126473 A1 | 7/2003 | Maciorowski et al. |
| 2004/0078723 A1 | 4/2004 | Gross et al. |
| 2005/0050087 A1 | 3/2005 | Milenova et al. |
| 2005/0052287 A1 | 3/2005 | Whitesmith et al. |
| 2005/0055590 A1 | 3/2005 | Farkas et al. |
| 2005/0111742 A1 | 5/2005 | Seo |
| 2005/0182807 A1 | 8/2005 | Ramaswamy et al. |
| 2005/0188263 A1 | 8/2005 | Gross et al. |
| 2005/0204316 A1 | 9/2005 | Nebel et al. |
| 2006/0010330 A1 | 1/2006 | Wu et al. |
| 2006/0095796 A1 | 5/2006 | Chotoku et al. |
| 2007/0124574 A1 | 5/2007 | Goldberg |
| 2008/0282117 A1 | 11/2008 | Partani et al. |
| 2009/0092038 A1 | 4/2009 | Mujtaba et al. |
| 2009/0132845 A1 | 5/2009 | Hsieh et al. |
| 2009/0271046 A1 | 10/2009 | Lewis et al. |
| 2009/0271049 A1 | 10/2009 | Kinney et al. |
| 2010/0318818 A1 | 12/2010 | Mangione-Smith |
| 2011/0054705 A1 * | 3/2011 | Vaidyanathan .... G05D 23/1931 700/282 |
| 2012/0158326 A1 * | 6/2012 | Vaidyanathan ..... G06F 11/3051 702/60 |
| 2013/0103968 A1 | 4/2013 | Conroy et al. |
| 2014/0121854 A1 | 5/2014 | Conroy et al. |
| 2014/0351621 A1 | 11/2014 | Conroy et al. |

FOREIGN PATENT DOCUMENTS

| | | |
|---|---|---|
| EP | 0875833 A1 | 11/1998 |
| JP | 2000-293557 A | 10/2000 |
| JP | 2002-334128 A | 11/2002 |
| WO | 95/25382 A1 | 9/1995 |

OTHER PUBLICATIONS

Rajesh Rajamani, Faulty Diagnostics for Intelligent Vehicle Application, May 2001, pp. 1-81.

Optimized support vector machines for nonstationary signal classification': Davy, 2002, IEEE, 10709908, IEEE signal processing letters, vol. 9, No. 12, pp. 442-445.

Mixture of SVMs for face class modeling': Meynet, MLMI 2004, LNCS 3361, pp. 173-181.

Gross et al, "Application of Model-Based Fault Detection System to Nuclear Power Plant Signals", 9th International Conference on Intelligent Systems Applications to Power Systems, Seoul, Korea, Jul. 6-10, 1997.

Gribok, Andrei V. et al., "Use of Kernel Based Techniques for Sensor Validation in Nuclear Power Plants", International Topical Meeting on Nuclear Plant Instrumentation, Controls and Human-Machine Interface Technologies, Washington D.C., Nov. 2000.

Goebel et al, "Fusing Diverse Monitoring Algorithms for Robust Change Detection", Proceedings of SPIE, Multisensor, Multisource Information Fusion, Architectures, Algorithms, and Applications, vol. 6242, pp. 192-202, Apr. 18, 2006.

Kazmeyer, Milton, "How Does a CPU Cooling Fan Work?", Chron, Online Available at <http://smallbusiness.chron.com/cpu-cooling-fan-work-61608.html>, Demand Media, Copyright 2016 Hearst Newspapers, LLC, 3 pages.

Gross et al., "Megawatt-Hours Avoided", Oracle White Paper, Oracle Quality Division, Oracle San Diego Physical Sciences Research Center, Online available at <http://www.oracle.com/us/products/applications/green/wp-warm-data-centers-waste-energy-2477158.pdf>, Mar. 7, 2015, 18 pages.

Cunningham, Andrew, "In-depth with the Snapdragon 810's heat problems", Ars Technica, Gear & Gadgets / Product News & Reviews, Online Available at <http://arstechnica.com/gadgets/2015/04/in-depth-with-the-snapdragon-810s-heat-problems/>, Apr. 23, 2015, 7 pages.

Comparetti, Alfredo Milani, "SpeedFan—Access Temperature Sensor in your Computer", SpeedFan, Online Available at <http://www.

(56) References Cited

OTHER PUBLICATIONS almico.com/speedfan.php>, SpeedFan 4.51, Copyright 2000-2015, Retrieved on Jan. 18, 2016, 2 pages.
"CPU Fan Control Options (Automatic Mode)", Overclockers, The Performance Computing Community, Online Available at <http://www.overclockers.com/forums/showthread.php/720841-CPU-Fan-Control-Options-%28Automatic-Mode%29>, Retrieved on Jan. 18, 2016, 5 pages.

* cited by examiner

DETERMINING PARAMETERS OF AIR-COOLING MECHANISMS

INCORPORATION BY REFERENCE; DISCLAIMER

This application is related to U.S. patent application Ser. No. 11/205,924, filed Aug. 17, 2005, now U.S. Pat. No. 7,869,965, issued Jan. 11, 2011; U.S. patent application Ser. No. 12/101,321, filed Apr. 11, 2008, now U.S. Pat. No. 8,214,682, issued. Jul. 3, 2012; U.S. patent application Ser. No. 12/181,121, filed Jul. 28, 2008, now U.S. Pat. No. 8,108,697, issued Jan. 31, 2012; U.S. patent application Ser. No. 10/903,160, filed Jul. 29, 2004, now U.S. Pat. No. 7,167,812, issued Jan. 23, 2007; U.S. patent application Ser. No. 11/081,983, filed Mar. 16, 2005, now U.S. Pat. No. 7,475,047, issued Jan. 6, 2009; U.S. patent application Ser. No. 10/809,721, filed Mar. 25, 2004, now U.S. Pat. No. 7,292,962, issued Nov. 6, 2007; U.S. patent application Ser. No. 11/210,570, filed Aug. 23, 2005, now U.S. Pat. No. 7,573,952, issued Aug. 11, 2009; U.S. patent application Ser. No. 11/194,954, filed Aug. 1, 2005, now U.S. Pat. No. 7,200,501, issued Apr. 3, 2007; U.S. patent application Ser. No. 11/348,655, filed Feb. 6, 2006, now U.S. Pat. No. 7,523,014, issued Apr. 21, 2009; U.S. patent application Ser. No. 11/342,057, filed Jan. 27, 2006, now U.S. Pat. No. 7,248,980, issued Jul. 24, 2007; U.S. patent application Ser. No. 11/656,736, filed Jan. 22, 2007, now U.S. Pat. No. 7,912,685, issued Mar. 22, 2011; and U.S. patent application Ser. No. 14/939,205, filed Nov. 12, 2015; each of which is hereby incorporated by reference. The Applicant hereby rescinds any disclaimer of claim scope in the parent application(s) or the prosecution history thereof and advises the USPTO that the claims in this application may be broader than any claim in the parent application(s).

TECHNICAL FIELD

The present disclosure relates to cooling components of a computer system. In particular, the present disclosure relates to determining parameters of air-cooling mechanisms that cool components of a computer system.

BACKGROUND

A computer system includes a large number of components, many of which are delicate and expensive. One or more computer systems, such as a telecommunications system and/or a storage system, may be housed in a data center. Example components of a computer system include but are not limited to processors, central processing units (CPUs), memory, and data storage. Many components have a maximum operating temperature, above which the components fail to operate.

Many air-cooling mechanisms are used to prevent the components of a computer system from overheating. Examples of air-cooling mechanisms include but are not limited to a Heating, Ventilation, and Air-Conditioner (HVAC) system, and a fan internal to a computer system. In some data centers, a significant amount of energy is used to unnecessarily cool components far below a maximum operating temperature of the components.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

The embodiments are illustrated by way of example and not by way of limitation in the figures of the accompanying drawings. It should be noted that references to "an" or "one" embodiment in this disclosure are not necessarily to the same embodiment, and they mean at least one. In the drawings.

DETAILED DESCRIPTION

Figure 1:
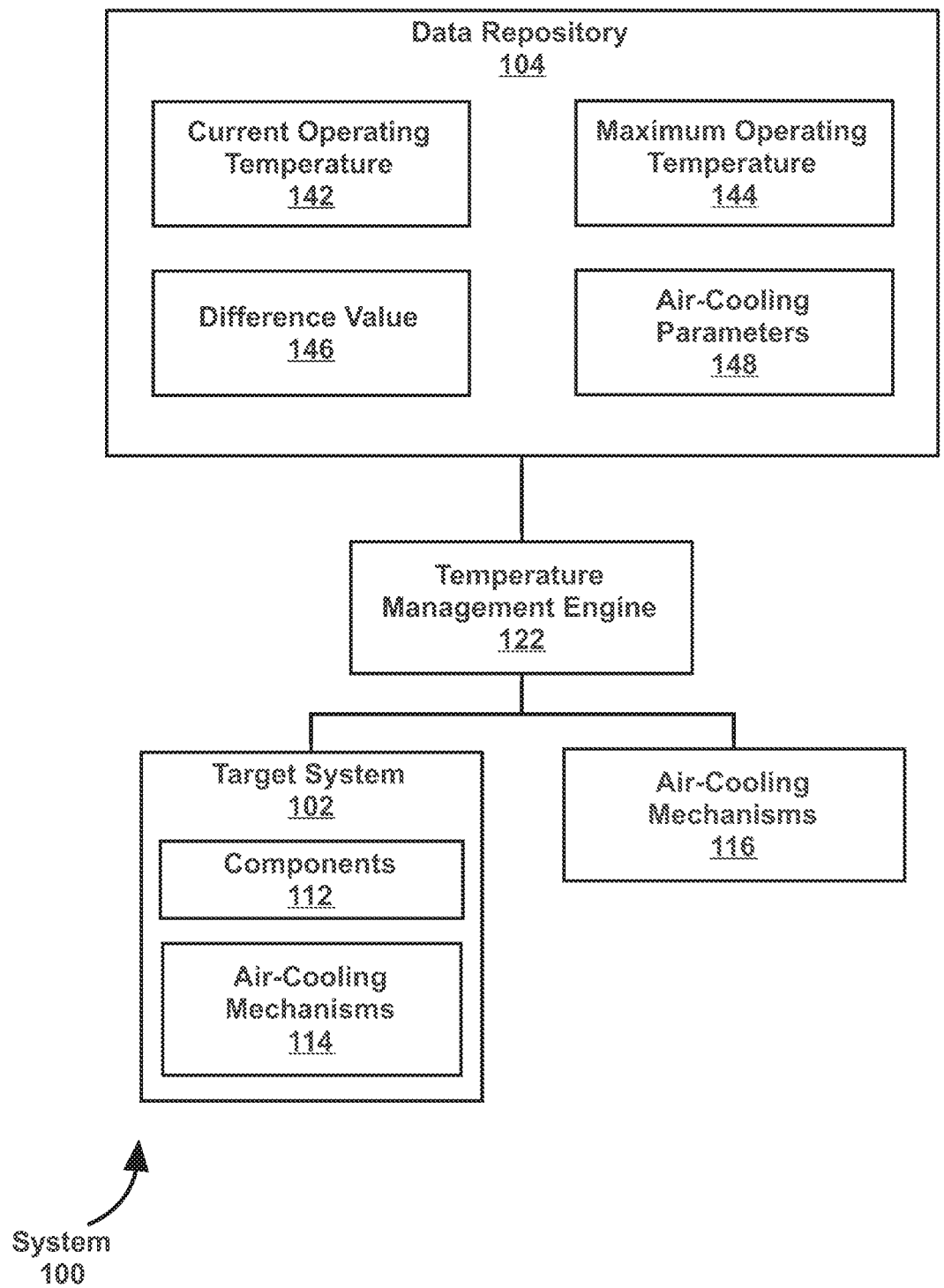
FIG. 1 illustrates a system in accordance with one or more embodiments.

In the following description, for the purposes of explanation, numerous specific details are set forth in order to provide a thorough understanding. One or more embodiments may be practiced without these specific details. Features described in one embodiment may be combined with features described in a different embodiment. In some examples, well-known structures and devices are described with reference to a block diagram form in order to avoid unnecessarily obscuring the present invention.

1. GENERAL OVERVIEW
2. ARCHITECTURAL OVERVIEW
3. DETERMINING PARAMETERS OF AIR-COOLING MECHANISMS THAT COOL A COMPONENT OF A TARGET SYSTEM
4. OPTIMIZING POWER USAGE
5. EXAMPLE EMBODIMENT
6. MISCELLANEOUS; EXTENSIONS
7. HARDWARE OVERVIEW

1. General Overview

One or more embodiments include determining parameters of one or more air-cooling mechanisms that cool a target system. The parameters for the air-cooling mechanisms are determined based on a difference value between (a) a current operating temperature of a system component(s) of the target system and (b) a maximum operating temperature of the system component(s). Examples of air-cooling mechanisms include but are not limited to a Heating, Ventilation, and Air-Conditioner (HVAC) system, and a fan internal to a computer system. An example of a parameter of an HVAC system is a target ambient temperature of the HVAC system. An example of a parameter of an internal fan is a fan speed of the internal fan.

In one or more embodiments, the current operating temperature of a system component is determined by monitoring the current operating temperature and/or by estimating the current operating temperature. A current operating temperature may be detected by a monitoring device disposed within the target system. A current operating temperature may be estimated based on historical data.

One or more embodiments are directed to avoiding unnecessary cooling of the system components to save energy, power, and/or resources. Air-cooling mechanisms are suspended and/or modified to allow for a system component to increase in temperature when the difference value between the current operating temperature and the maximum operating temperature of the system component is above a desired range.

One or more embodiments are directed to selecting an air-cooling mechanism for cooling a target system based on a difference value between (a) the current operating temperature a system component of the target system and (b) a maximum operating temperature of the system component. If cooling of the system component is needed with urgency, an air-cooling mechanism within the target system may be modified to cause immediate cooling of the system component. In an example, cooling of the system component is needed with urgency when the system component is at a risk of overheating that is greater than a threshold value. If cooling of the system is needed without urgency, then an air-cooling mechanism outside of the target system may be modified to slowly cool the system component. In an example, cooling of the system component is needed without urgency, when the system component needs to be cooled down to a desired range but is not at a risk of overheating that is above a threshold value.

2. Architectural Overview

FIG. 1 illustrates a system 100 in accordance with one or more embodiments. As illustrated in FIG. 1, system 100 includes a target system 102 (including one or more air-cooling mechanisms 114), a data repository 104, one or more air-cooling mechanisms 116, and a temperature management engine 122. In one or more embodiments, system 100 may include more or fewer components than the components illustrated in FIG. 1. The components illustrated in FIG. 1 may be local to or remote from each other. The components illustrated in FIG. 1 may be implemented in software and/or hardware and may be distributed over one or more applications and/or machines. Operations described with respect to one component may instead be performed by another component.

In one or more embodiments, target system 102 includes one or more computer systems for which temperature is being regulated in an energy efficient manner. In an embodiment, target system 102 is located within a room of a data center. Examples of target system 102 include but are not limited to a computer, a tablet, a laptop, a desktop, a netbook, server, a web server, a network policy server, a server rack(s), storage devices, a mainframe, a television, a content receiver, a set-top box, a printer, a mobile handset, a smart phone, and a personal digital assistant ("PDA").

In an embodiment, target system 102 includes one or more components 112. Examples of components 112 include but are not limited to processors, Central Processing Units (CPUs), Hard Disk Drives (HDDs), and Dual in-line Memory Modules (DIMMs). In an example, a server (target system) may include multiple CPUs (components).

In an embodiment, target system 102 includes one or more air-cooling mechanisms 114 disposed within target system 102. In an example, a server may have an external cover or shell. One or more internal fans may be disposed inside an internal space enclosed by the external cover. The internal fans may serve to cool one or more server components that are co-located in the internal space.

In one or more embodiments, components within target system 102 are cooled with one or more air-cooling mechanisms 116 which are external to target system 102. Air-cooling mechanisms 116 are configured to regulate the temperature of a space surrounding and/or adjacent to the target system 102 that includes component 112. For example, an air-cooling mechanism may control an ambient temperature of a room enclosing target system 102. The temperature of the space surrounding and/or adjacent to the target system 102 that includes component 112 indirectly affects the current operating temperature 142 of the component 112. In an example, a server may be located in a room of a data center. A heating, ventilation, and air-conditioner (HVAC) system (also referred to herein as a "Computer Room Air Conditioner" (CRAC)) may regulate the ambient temperature of the room. The vents of the HVAC system (which provide the regulated ambient temperature) may be located inside the room but external to the server. When the ambient temperature of the room is lower than the operating temperature of the component 112, heat diffuses from the component 112. As a result of the heat diffusing from the component 112, the current operating temperature of the component 112 is reduced.

In one or more embodiments, air-cooling parameters 148, as illustrated in data repository 104, are parameters for configuring air-cooling mechanisms 114 and/or air-cooling mechanisms 116. In an embodiment, an air-cooling parameter 148 is a target ambient temperature of an HVAC system for a room enclosing target system 102. The HVAC system detects the current ambient temperature, for example, from a thermostat corresponding to the HVAC system. The HVAC system emits or does not emit cool air in order to maintain the current ambient temperature of the room at approximately the target ambient temperature.

In an embodiment, an air-cooling parameter 148 includes one or more specified fan speeds of one or more internal fans of target system 102. An internal fan rotates at approximately the corresponding specified fan speed.

In one or more embodiments, data repository 104 is any type of storage unit and/or device (e.g., a file system, database, collection of tables, or any other storage mechanism) for storing data. Further, data repository 104 may include multiple different storage units and/or devices. The multiple different storage units and/or devices may or may not be of the same type or located at the same physical site. Further, data repository 104 may be or may execute on the same computing system as temperature management engine 122. Alternatively or additionally, data repository 104 may be on a separate computing system than temperature management engine 122. Data repository 104 may be connected to temperature management engine 122 via a direct connection or via a network.

Data sets describing a current operating temperature 142, a maximum operating temperature 144, a difference value 146, and one or more air-cooling parameters 148 may be implemented across any of components within system 100. However, these data sets are illustrated within data repository 104 for purposes of clarity and explanation.

In one or more embodiments, current operating temperature 142 is a current temperature of component 112. Current operating temperature 142 may be detected and/or estimated as described below with reference to Operation 202 of FIG. 2A.

In one or more embodiments, maximum operating temperature 144 is a maximum temperature at which component 112 may operate. In an embodiment, a component 112 fails to operate, overheats, becomes defective, and/or causes errors when the current operating temperature 142 of the component 112 exceeds the maximum operating temperature 144 of the component 112. The undesired results, associated with the component 112 operating at a temperature above the maximum operating temperature, may occur (a) immediately upon operating temperature of the component 112 exceeding the maximum operating temperature or (b) after the component 112 operates at an operating temperature above the maximum operating temperature for a period of time. In an example, when a maximum operating temperature of a server is reached, the server shuts down. However, any down time of the server may be costly to one or more entities (such as corporations, businesses, and organizations) relying on the server. For example, down time of the server may cause the entity to be unable to serve customer requests, thereby losing a number of customers and/or business opportunities. As another example, down time of the server may cause the entity to lose critical data, which is costly to reconstruct.

In an embodiment, the maximum operating temperature 144 of the component 112 may be indicated by a manufacturer or other vendor associated with the component 112. Additionally or alternatively, the maximum operating temperature 144 of the component 112 may be determined by testing and analysis. In an example, a system component is monitored to identify a particular time period when an error rate and/or a failure rate for the system component exceeds a threshold value. The detected temperature of the system component, during the particular time period, is selected as the "maximum operating temperature," as referred to herein.

In one or more embodiments, difference value 146 is a difference between the current operating temperature 142 of a component 112 and the maximum operating temperature 144 of the component 112.

In one or more embodiments, temperature management engine 122 refers to hardware and/or software configured to perform operations described herein for determining air-cooling parameters 148 of air-cooling mechanisms 114 and/or air-cooling mechanisms 116 that cool target system 102. The temperature management engine 122 may be implemented on any device that includes a hardware processor. The temperature management engine 122 may be implemented on the target system 102 itself or another device separate from the target system 102. Operations for determining parameters of air-cooling mechanisms for target system is described below with reference to FIGS. 2A-2C.

In an embodiment, temperature management engine 122 obtains the current operating temperature 142 of one or more components from one or more sensors that monitor the current operating temperature 142 of the one or more components. In one example, a thermistor within the target system 102 may measure the current operating temperature of one or more components. The thermistor may report the current operating temperature to the temperature management engine 122. In another example, a sensor is a transducer. The transducer is disposed inside of target system 102. The transducer is located in a same internal space within target system 102 as a particular component 112 whose current operating temperature 142 is being monitored by the transducer. For example, the transducer may be located on or near the particular component 112. The transducer transmits signals representing current operating temperature 142 to the temperature management engine 122.

Figure 2A:
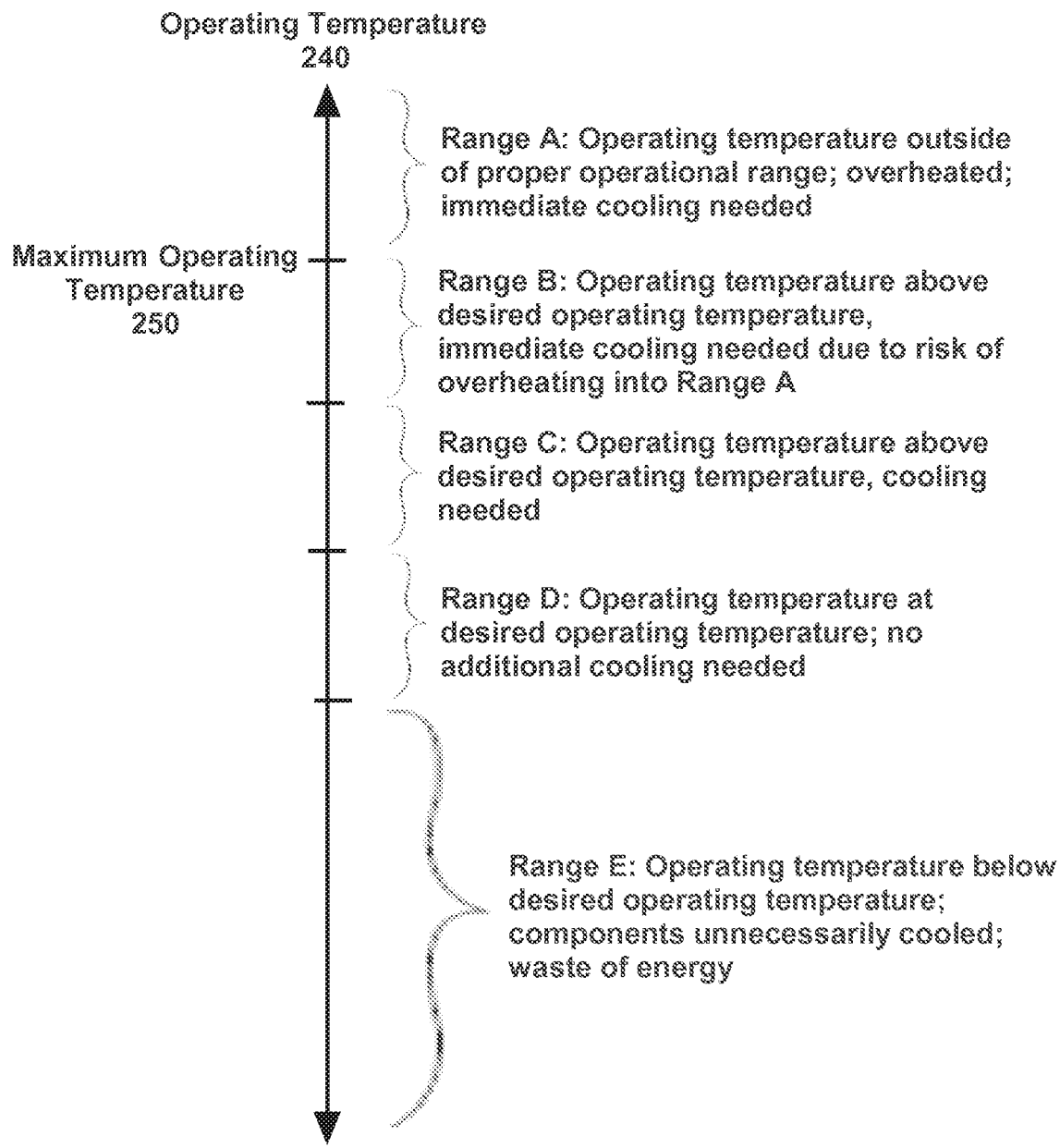
FIG. 2A illustrates examples of temperature ranges associated with an operating temperature of a system component of a target system, in accordance with one or more embodiments.
Figure 2B:
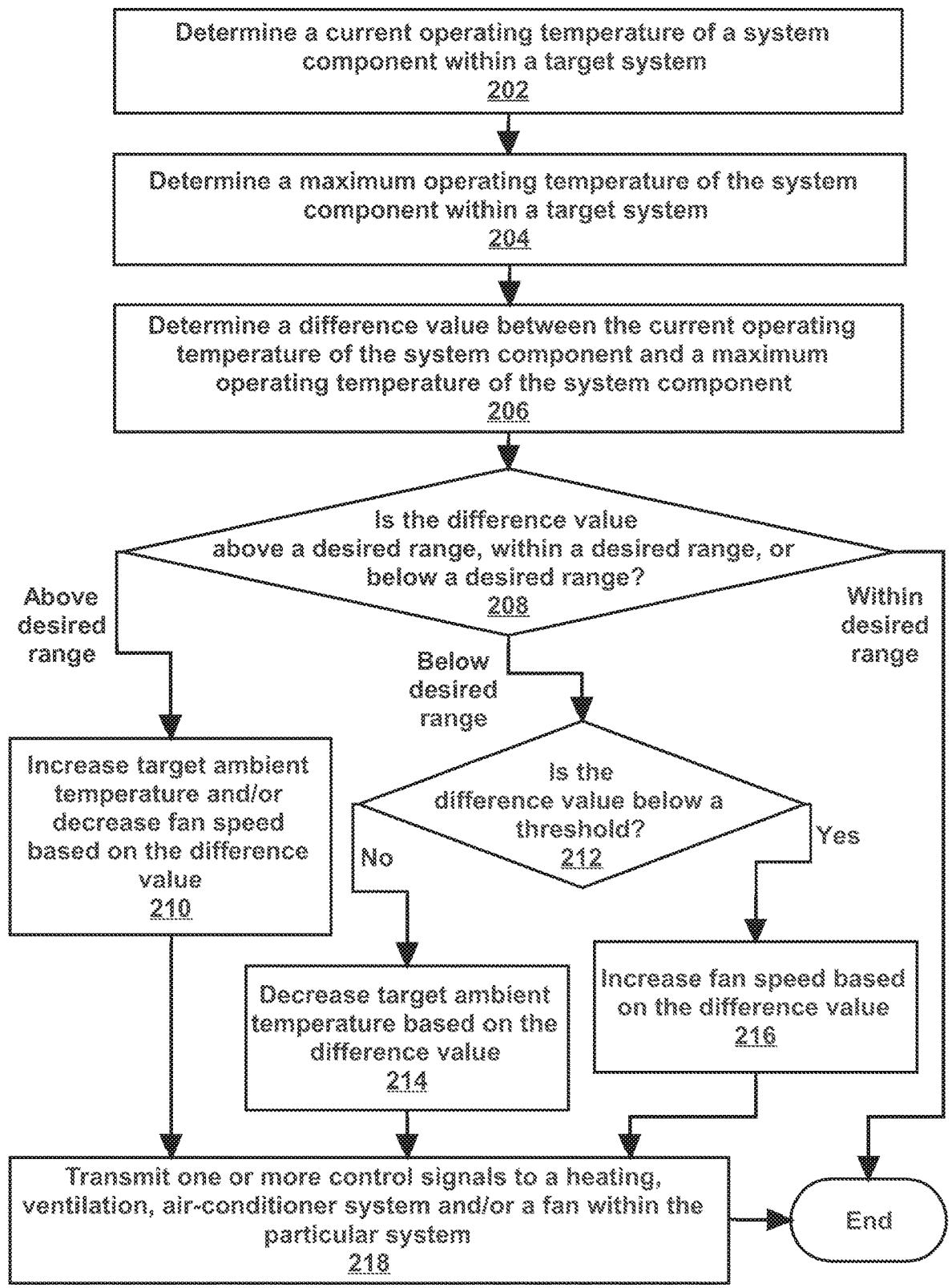
FIG. 2B illustrates an example set of operations for determining parameters of air-cooling mechanisms to operate a system component of a target system at the desired operating temperature, in accordance with one or more embodiments.

3. Determining Parameters of Air-Cooling Mechanisms that Cool a Component of a Target System FIG. 2A illustrates examples of temperature ranges associated with an operating temperature of a system component of a target system. FIG. 2B illustrates operations for determining parameters of air-cooling mechanisms to operate the system component at the desired operating temperature (see range D of FIG. 2A). Other components within the same target system or other target system may include a different set of temperature ranges. The illustrated thresholds and corresponding range descriptions are to be understood as examples and should not be construed as limiting the scope of any of the claims.

A vertical scale illustrates the operating temperature 240 of a system component of a target system (e.g., a server). The operating temperature 240 may fall into one of a set of ranges A-E. A proper operating range of the system component includes an operating temperature 240 below the maximum operating temperature 250. Range A is outside of the proper operating range of the system component. Ranges B-E are within the proper operating range of the system component.

Range A is a range of the operating temperature 240 that is higher than a proper operating range. Specifically, range A is higher than a maximum operating temperature 250. When a system component is at an operating temperature that is higher than a maximum operating temperature, the system component is overheated. As noted above, operating at a temperature that is higher than a maximum operating temperature may result in failure, errors, and/or other undesired results. When a system component is above the maximum operating temperature, immediate cooling of the system component is needed.

Range B is a range of the operating temperature 240 that is within the proper operating range. However, range B is above a desired operating range of the operating temperature 240. When a system component has an operating temperature that is within range B, the system component is at a risk of overheating into range A. When a system component has an operating temperature in range B, immediate cooling of the system component is urgently needed.

Range C is a range of the operating temperature 240 that is within the proper operating range. However, range C is above a desired operating range of the operating temperature 240. When a system component has an operating temperature in range C, cooling of the system component is needed. However, there is a buffer (range B) until the operating temperature 240 exceeds the maximum operating temperature 250. Accordingly, cooling of a system component with an operating temperature in range C is not as urgent as cooling of a system component in range B.

One or more embodiments described below, with reference to FIG. 2B, include selection of an air-cooling mechanism for cooling of a system component. If an operating temperature of a system component is within range B, an air-cooling mechanism(s which can provide immediate cooling is selected for cooling the system component. If an operating temperature of a system component is within range C, any air-cooling mechanism(s) may be selected for cooling the system component.

Range D is a range of the operating temperature 240 that includes the desired operating temperatures of the system component. Range D is the desired operating temperature because:
    a. Range D is well below the maximum operating temperature 250 and not at a risk of overheating into range A.
    b. Range D is higher than Range E (described below).

Range E is a range of the operating temperature 240 that is within the proper operating range of the system component. Furthermore, range E (a) includes operating temperatures well below the maximum operating temperature 250 and (b) is not at a risk of overheating into range A. However, operating temperatures within range E are not desired operating temperatures. When a system component has an operating temperature within range E, the system component has likely been unnecessarily cooled. Unnecessarily cooling a system component wastes energy and results in increased energy bills. If the system component has simply been cooled naturally into range E (e.g., by cold weather), then there is no waste of energy. Range E is outside of a desired operating range, as referred to herein, when a system component is unnecessarily cooled down to range E using one or more air-cooling mechanisms described herein, FIG. 2B illustrates an example set of operations for determining parameters of air-cooling mechanisms that cool a target system in accordance with one or more embodiments. One or more operations illustrated in FIG. 2B may be modified, rearranged, or omitted all together. Accordingly, the particular sequence of operations illustrated in FIG. 2B should not be construed as limiting the scope of one or more embodiments.

One or more embodiments include determining a current operating temperature of a system component within a target system. (Operation 202). The current operating temperature is determined by monitoring the current operating temperature and/or by estimating the current operating temperature.

In an embodiment, one or more sensors monitor e current operating temperature of the system component. A sensor outputs signals representing the current operating temperature. The signals are processed for validation prior to being used for determining parameters of air-cooling mechanisms. An example process of validation is described below with reference FIG. 3.

In an embodiment, signals comprising the current operating temperature of a component are transmitted to an operating system or application executing on the target system. The operating system or application executing on the target system may continuously or periodically forward the data identifying the current operating temperature of one or more components within the target system. In another embodiment, signals comprising the current operating temperature of a component are transmitted to a separate computing system. Signals comprising values for the current operating temperature of multiple components, within multiple target systems, may be transmitted to the separate computing system.

In an embodiment, historical data associated with the system component is collected and stored database or other memory. The historical data may include, for example, an operating temperature of the system component, an ambient temperature, a throughput, and a load. Cycles and/or patterns in the historical data are identified. Based on the cycles and/or patterns, a current operating temperature is estimated.

In an example, the current operating temperature at a particular time may be estimated based on a historical operating temperature readings on other days at the particular time. The operating temperature of a system component may be detected at 9 am each day for a one-week period. The average of the detected operating temperature during the one-week period may be computed as 13 degrees Celsius. Subsequent to the one-week period, the current operating temperature at 9 am is estimated to be 13 degrees Celsius based on the computed average value of 13 degrees Celsius.

One or more embodiments include determining a maximum operating temperature of the system component within the target system (Operation 204). In an embodiment, the maximum operating temperature for the system component is determined from a specification associated with the system component. In an example, a query may be executed based on an identifier of the system component. The query may result in identification of the maximum operating temperature for the system component as specified by the manufacturer of the component. In another example, the maximum operating temperature of the system component may be determined based on historical data associated with the system component. In this example, the system component may be monitored to identify the operating temperatures at which the system component fails to operate properly, fails to operate without errors, and/or operates with any other undesired results. A threshold operating temperature, below operating temperatures that result in undesired results, may be selected as a maximum operating temperature for the system component.

One or more embodiments include determining a difference value between the current operating temperature and the maximum operating temperature (Operation 206). The difference value is computed by subtracting the current operating temperature from the maximum operating temperature. As described above, the current operating temperature may be determined based on a validated signal received from a sensor and/or may be estimated based on historical data.

In an embodiment, current operating temperatures of multiple system components within the particular system are obtained. Maximum operating temperatures of the system components are also obtained. A difference value between the current operating, temperature and the maximum operating temperature is computed for each system component. The minimum difference value, of the computed difference values, is selected for determining parameters of one or more air-cooling mechanisms that cool the particular system.

In one or more embodiments, an inquiry is made as to whether the difference value is above a desired range, within a desired range, or below a desired range (Operation 208).

Figure 2C:
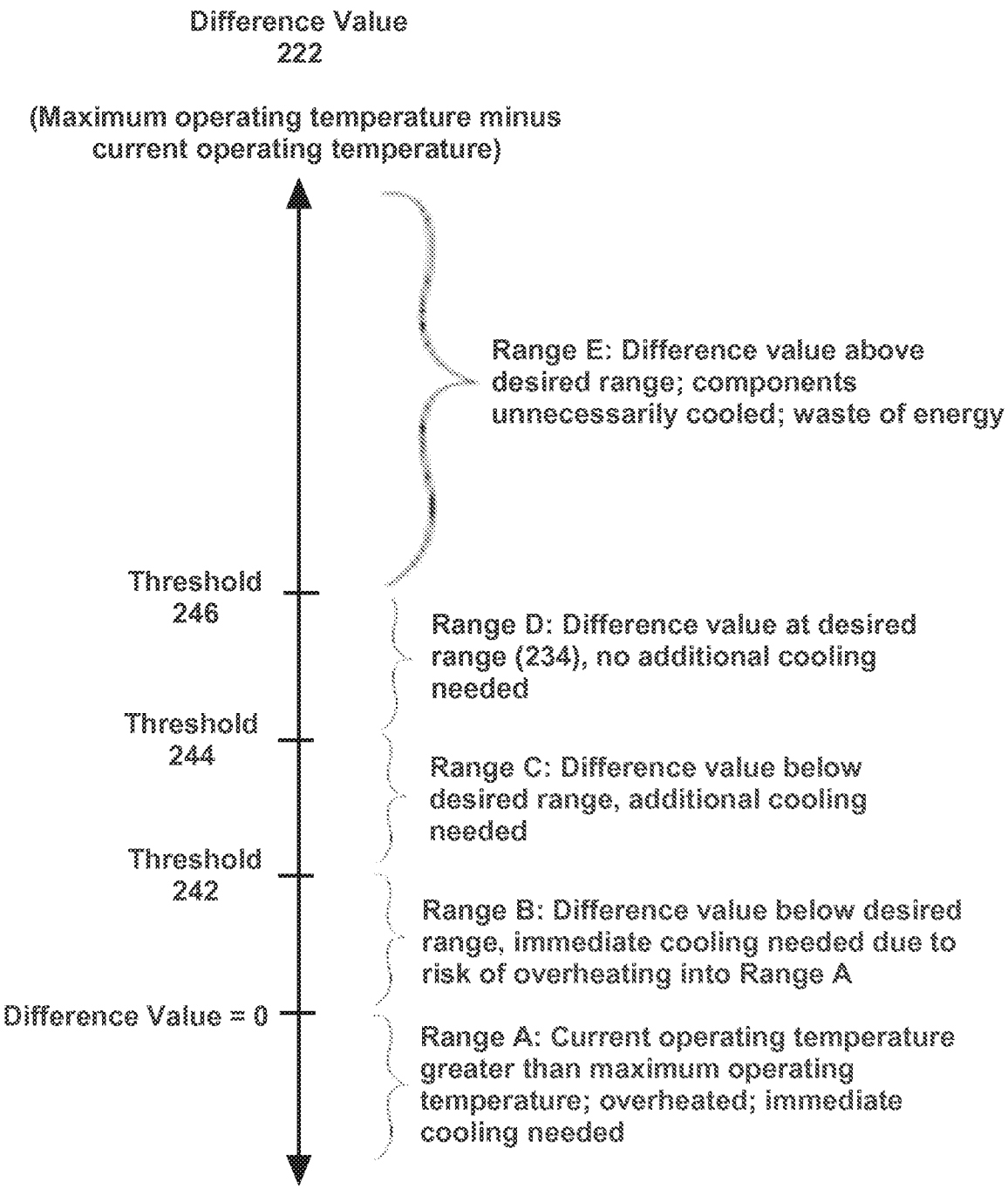
FIG. 2C illustrates an example of a desired range of a difference value, in accordance with one or more embodiments.

FIG. 2C illustrates an example of a desired range of a difference value, in accordance with one or more embodiments. The desired range of the difference value, as illustrated in FIG. 2C is based on the desired range of the operating temperature as described above with reference to FIG. 2A. Ranges A-E fair the operating temperature, as illustrated in FIG. 2A, correspond respectively to the ranges A-E for the difference value, as illustrated in FIG. 2C. The y-axis represents the difference value 222 computed by subtracting a current operating temperature from a maximum operating temperature of a system component. The desired range 234 of the difference value is between threshold 244 and threshold 246. If the difference value is below threshold 244, then the difference value is below the desired range 234. If the difference value is above threshold 244, then the difference value is above the desired range 234.

In an example, a desired range for the difference value may be 5 to 8 degrees Celsius. Referring to FIG. 2C, threshold 244 would be 5 degrees Celsius, and threshold 246 would be 8 degrees Celsius. If the difference value is 6 degrees Celsius, then the difference value would be within desired range 234. If the difference value is 3 degrees Celsius, then the difference value would be below desired range 234. If the difference value is 10 degrees Celsius, then the difference value would be above desired range 234.

In one or more embodiments, if the difference value is within the desired range, then the process ends. The current operating temperature of the system component is within an optimal range that both prevents failure of the system component due to overheating, and reduces excessive energy used towards unnecessary cooling of the system component.

In one or more embodiments, if the difference value is above the desired range, then a target ambient temperature is increased and/or at least one fan speed is decreased based on the difference value (Operation 210). The target ambient temperature is an ambient temperature that is desired to be maintained by a heating, ventilation, and air-conditioner (HVAC) system for the particular system. The HVAC regulates an ambient temperature of a room enclosing the particular system.

In an embodiment, the target ambient temperature is increased by a fixed amount whenever the difference value is above the desired range. The fixed amount is specified in a table, database, or other memory.

In an embodiment, the target ambient temperature is increased by an amount that varies based on the difference value. The amount of increase in the target ambient temperature is a function of the difference value. In an example, a formula may specify a relationship between the amount of increase in the target ambient temperature and the difference value. In another example, a look-up table may specify a relationship between the amount of increase in the target ambient temperature and the difference value.

In an example, the amount of increase in the target ambient temperature may be determined as a function of the difference value using a look-up table. Initially, the target ambient temperature of an HVAC system may be 12 degrees Celsius. The difference value may be determined to be 10 degrees Celsius, which is above a specified desired range. Based on the look-up table, a difference value of 10 degrees Celsius may correspond to a two-degree increase in the target ambient temperature. The target ambient temperature would be increased to 14 degrees Celsius. Subsequently, the difference value may be determined to be 8 degrees Celsius, which is still above the specified desired range. Based on the look-up table, a difference value of 8 degrees Celsius may correspond to a one-degree increase in the target ambient temperature. The target ambient temperature would be increased to 15 degrees Celsius.

In an embodiment, the fan speed is the speed at which at least one internal fan within the particular system is to operate. The internal fan and the system component (whose operating temperature is being regulated) are co-located within a same internal space within the particular system. The fan speed may be decreased by a fixed amount whenever the difference value is above the desired range, or by an amount that varies based on the difference value.

In an embodiment, the target ambient temperature, one or more fan speeds of one or more internal fans, or both are modified based on the difference value. Which parameter(s) to modify, corresponding to various difference values, are stored in a look-up table. In an example, a look-up table may indicate three sub-ranges within the range of difference values that are above the desired range (Range E in FIG. 2C). The three sub-ranges may be referred to herein as Range F, Range G, and Range H, respectively. Range F may be lower than Range G, and Range G may be lower than Range H. The look-up table may indicate that a difference value within Range F corresponds to decreasing the fan speed of the internal fan. The look-up table may indicate that a difference value within Range G corresponds to increasing the target ambient temperature of the HVAC system. The look-up table may indicate that a difference value within Range H corresponds to both decreasing the fan speed and increasing the target ambient temperature.

In an embodiment, additional and/or alternative measures that affect the current operating temperature of the system component (not shown) are modified based on the difference value. In an example, a throttling rate of the system component may be modified. If the difference value is above the desired value, then the limit on the speed at which the system component processes operations would be increased. The system component would be allowed to process operations at a higher speed.

In one or more embodiments, if the difference value is below the desired range, then an inquiry is made as to whether the difference value is below a threshold (Operation 212). Referring to FIG. 2C, the difference value is compared to threshold 242 (which is below desired range 234). A difference value that is not below threshold 242 (within Range C) indicates that the risk that the system component would overheat is below a threshold. Gradual cooling of the system component is sufficient. A difference value that is below threshold 242 (within Range B) indicates that the risk that the system component would overheat is above a threshold. Immediate cooling of the system component is required.

In an embodiment, additional and/or alternative inquiries (not shown) are made in order to determine what measures are to be taken to drive the difference value within the desired range. In an example, an inquiry may be made as to the duration within which the difference value remained below the desired range.

In one or more embodiments, if the difference value is not below the threshold, then the target ambient temperature is decreased based on the difference value (Operation 214). Referring again to FIG. 2B, if the difference value is between threshold 242 and threshold 244, then the target ambient temperature is decreased based on the difference value. The target ambient temperature may be decreased by a fixed amount whenever the difference value is below the desired range but above the threshold, or by an amount that varies based on the difference value.

In an embodiment, additional and/or alternative measures that affect the current operating temperature of the system component (not shown) are modified based on the difference value. If the difference value is not below the threshold, then one or more air-cooling mechanisms that reduce the current operating temperature of the system component at a relatively slow speed are used. For example, an HVAC system may be used, since the HVAC system cools the system component at a slower speed than an internal fan associated with the system component. As another example, an external fan for the room enclosing the particular system (such as an exhaust fan) may be used, since the external fan cools the system component at a slower speed than the HVAC system.

In one or more embodiments, if the difference value is below the threshold, then at least one fan speed is increased based on the difference value (Operation 214). Referring again to FIG. 2B, if the difference value is below threshold 242, then at least one fan speed is increased based on the difference value. The fan speed may be increased by a fixed amount whenever the difference value is below the threshold, or by an amount that varies based on the difference value.

In one or more embodiments, additional and/or alternative measures that affect the current operating temperature of the system component (not shown), are modified based on the difference value. If the difference value is below the threshold, then one or more air-cooling mechanisms that reduce the current operating temperature of the system component at a relatively fast speed are used. In an example, both the target ambient temperature may be decreased and the fan speed may be increased. In another example, a throttling rate of a system component may be decreased, since the rate at which the system component processes operations affects the current operating temperature of the system component more quickly than an internal fan associated with the system component.

In one or more embodiments, after determining the target ambient temperature and/or fan speed, one or more control signals are transmitted to an HVAC system and/or a fan within the particular system (Operation 218). The control signals indicate the determined target ambient temperature and/or the determined fan speed. The control signals may be transmitted via wired or wireless communications.

In an example, a control signal indicating the determined target ambient temperature may be transmitted to a thermostat of an HVAC system. If the thermostat detects that the current ambient temperature is above the target ambient temperature, then the HVAC system may emit cool air. If the thermostat detects that the current ambient temperature is below the target ambient temperature, then the HVAC system may emit hot air, or may emit less cool air. Alternatively, if the thermostat detects that the current ambient temperature is below the target ambient temperature, and the external temperature (of an environment external to the room enclosing the particular system) is above the current ambient temperature, the HVAC system does not emit cool air or hot air, allowing the current ambient temperature of the room to rise naturally due to the external temperature.

In one or more embodiments, an increase of the target ambient temperature and/or a decrease in the fan speed causes an increase in the current operating temperature of the system component. A decrease of the target ambient temperature and/or an increase in the fan speed causes a decrease in the current operating temperature of the system component.

4. Optimizing Power Usage

In one or more embodiments, power consumption by an HVAC system for a particular system is reduced by increasing a target ambient temperature. The increase in the target ambient temperature reduces the difference value between a current operating temperature of a system component and a maximum operating temperature of the system component, driving the difference value within a desired range.

In one or more embodiments, total power consumption across multiple air-cooling mechanisms is optimized by selecting parameters for the air-cooling mechanisms that result in reducing the difference value in an energy-efficient manner. If the difference value is too small, indicating that the current operating temperature is coming very close to the maximum operating temperature, then an air-cooling mechanism that more quickly reduces the current operating temperature is selected. Conversely, if the difference value is large, then an air-cooling mechanism that gradually reduces the current operating temperature is selected.

5. Example Embodiment

Figure 3:
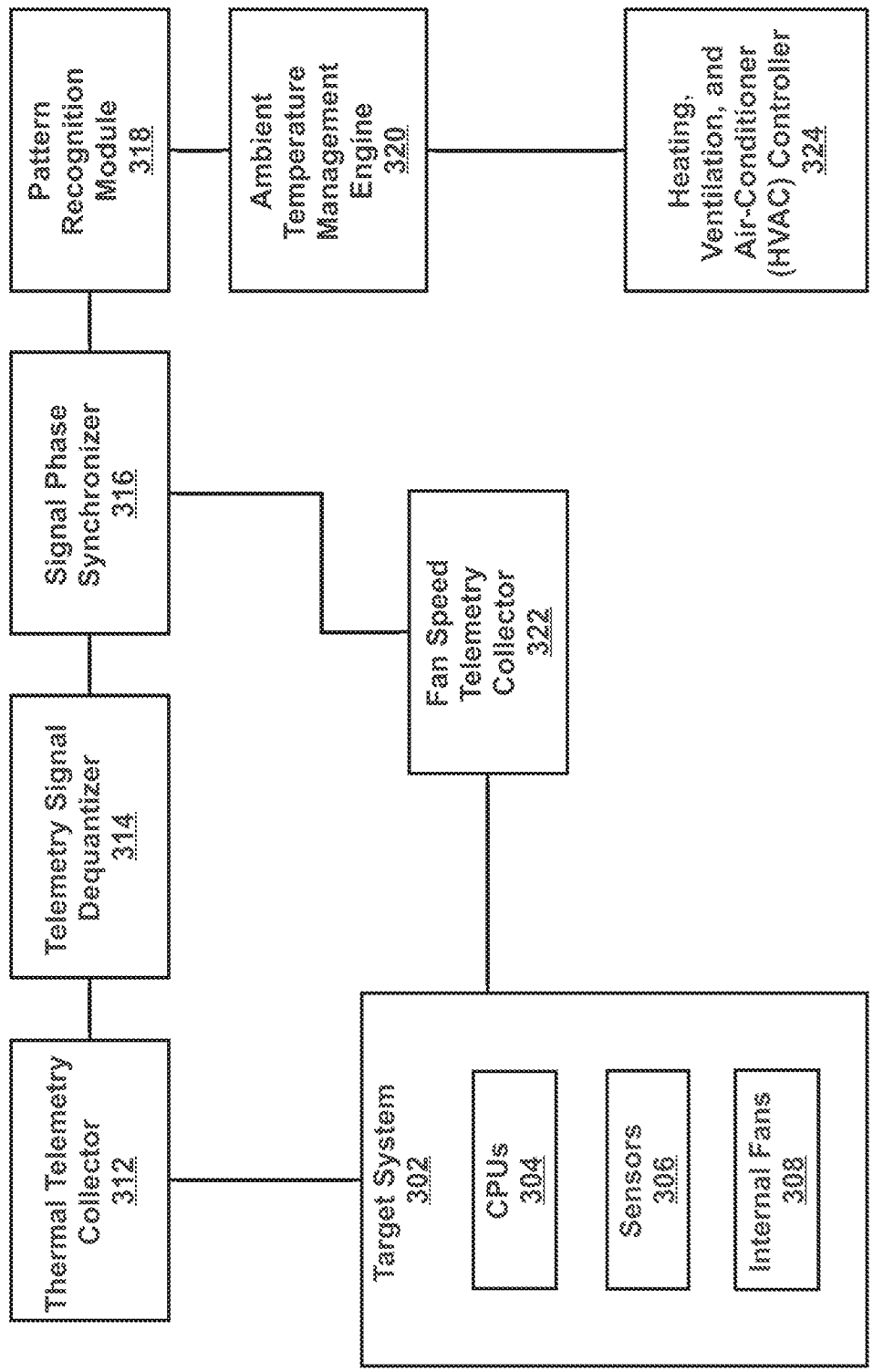
FIG. 3 illustrates an example of determining a target ambient temperature of a heating, ventilation, and air-conditioner (HVAC) system for a target system, in accordance with one or more embodiments.

FIG. 3 illustrates an example of determining a target ambient temperature of a heating, ventilation, and air-conditioner (HVAC) system for a target system, in accordance with one or more embodiments. A detailed example is described below for purposes of clarity. Components and/or operations described below should be understood as one specific example which may not be applicable to certain embodiments. Accordingly, components and/or operations described below should not be construed as limiting the scope of any of the claims.

In an example, target system 302 is a computer system for which a current operating temperature to be regulated. Target system 302 may be an enterprise server or an engineered system, including multiple central processing units (CPUs) 304, sensors 306, and internal fans 308. Each CPU 304 is associated with a sensor 306 and an internal fan 308.

A current operating temperature of a particular CPU 304 is detected by a particular sensor 306. The particular sensor 306 is a low-resolution analog-to-digital (ADC) chip (having, for example, 8-bit resolution). Due to the low resolution, a signal reported by the particular sensor indicates a limited set of prescribed values (for example, 256 values, in the case of 8-bit resolution). In other words, the signal is "quantized." Further, the particular sensor 306 may degrade over time and/or drift out of calibration over time. Therefore, a signal reported by the particular sensor 306 may or may not accurately indicate the current operating temperature.

The particular sensor 306 transmits a quantized and un-validated signal representing the current operating temperature of the particular CPU 304 to thermal telemetry collector 312. Thermal telemetry collector 312 transmits the signal to telemetry signal dequantizer 314. Telemetry signal dequantizer 314 removes and/or mitigates the quantization effects. Some examples of removing and/or mitigating the quantization effects of the signals are described at U.S. patent application Ser. No. 10/903,160, filed. Jul. 29, 2004, now U.S. Pat. No. 7,167,812, issued Jan. 23, 2007; U.S. patent application Ser. No. 11/081,983, filed Mar. 16, 2005, now U.S. Pat. No. 7,475,047, issued Jan. 6, 2009; U.S. patent application Ser. No. 10/809,721, filed Mar. 25, 2004, now U.S. Pat. No. 7,292,962, issued Nov. 6, 2007; U.S. patent application Ser. No. 11/210,570, filed. Aug. 23, 2005, now U.S. Pat. No. 7,573,952, issued Aug. 11, 2009; U.S. patent application Ser. No. 11/194,954, filed Aug. 1, 2005, now U.S. Pat. No. 7,200,501, issued Apr. 3, 2007; U.S. patent application Ser. No. 11/348,655, filed Feb. 6, 2006, now U.S. Pat. No. 7,523,014, issued Apr. 21, 2009; U.S. patent application Ser. No. 11/342,057, filed Jan. 27, 2006, now U.S. Pat. No. 7,248,980, issued Jul. 24, 2007; and U.S. patent application Ser. No. 11/656,736, filed Jan. 22, 2007, now U.S. Pat. No. 7,912,685, issued Mar. 22, 2011; each of which is hereby incorporated by reference.

Telemetry signal dequantizer 314 then transmits the de-quantized signal to signal phase synchronizer 316. Signal phase synchronizer 316 also receives, from fan speed telemetry collector 322, a signal representing a fan speed of a particular internal fan 308 associated with the particular CPU 304. Signal phase synchronizer 316 also receives other signals, such as a signal representing an ambient temperature of a room enclosing target system 302.

The signals received by signal phase synchronizer 316 may be initially out of synchrony. The lack of synchrony is caused by the use of multiple internal clocks (including hardware clocks and software clocks) within target system 102. Each signal may reference a different clock within target system 102. Further, each signal may be sampled at a different rate.

Signal phase synchronizer 316 is configured to synchronize the received signals. Signal phase synchronizer 316 applies an analytical resampling process. Some examples of synchronizing signals are described in U.S. patent application Ser. No. 12/101,321, filed Apr. 11, 2008, now U.S. Pat. No. 8,214,682, issued Jul. 3, 2012.

Signal phase synchronizer 316 transmits the synchronized signals to pattern recognition module 318. Pattern recognition module 318 uses non-linear non-parametric (NLNP) regression to determine whether the synchronized signals match a particular pattern. An example NLNP technique is a multivariate state estimation technique (MSET). Some examples of utilizing MSET in NLNP regression are described in U.S. patent application Ser. No. 08/666,938, filed Jun. 19, 1996, now U.S. Pat. No. 5,764,509, issued Jun. 9, 1998. Alternatively, other pattern recognition techniques, such as neutral networks, kernel regression, and linear regression, may be used. If there is a match between the synchronized signals and a particular pattern, then the synchronized signals are determined to be validated. If not, then the synchronized signals are determined to be non-validated.

Pattern recognition module 318 transmits a validated signal indicating the current operating temperature of the particular CPU 304 to ambient temperature management engine 320. Ambient temperature management engine 320 obtains a maximum operating temperature of the particular CPU 304 from a database. Ambient temperature management engine 320 computes a difference value between the current operating temperature and the maximum operating temperature. Ambient temperature management engine 320 determines that the difference value is above a specified desired range, indicating that the current operating temperature is excessively lower than the maximum operating temperature. Ambient temperature management engine 320 determines a new, increased target ambient temperature (for example, increased from 13 to 15 degrees Celsius) based on the difference value.

Ambient temperature management engine 320 transmits a control signal indicating that the new target ambient temperature (for example, 15 degrees Celsius) to an HVAC controller 324. The HVAC controller 324 manages the HVAC system, if the current ambient temperature is below the target ambient temperature, then the HVAC system does not emit cool air. If the current ambient temperature is above the target ambient temperature, then the HVAC system emits cool air. Based on the new, increased target ambient temperature, the HVAC system refrains from emitting cool air. The current ambient temperature of the room enclosing target system 302 is increased.

6. Miscellaneous Extensions

Embodiments are directed to a system with one or more devices that include a hardware processor and that are configured to perform any of the operations described herein and/or recited in any of the claims below.

In an embodiment, a non-transitory computer readable storage medium comprises instructions which, when executed by one or more hardware processors, causes performance of any of the operations described herein and/or recited in any of the claims.

Any combination of the features and functionalities described herein may be used in accordance with one or more embodiments. In the foregoing specification, embodiments have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

7. Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 4:
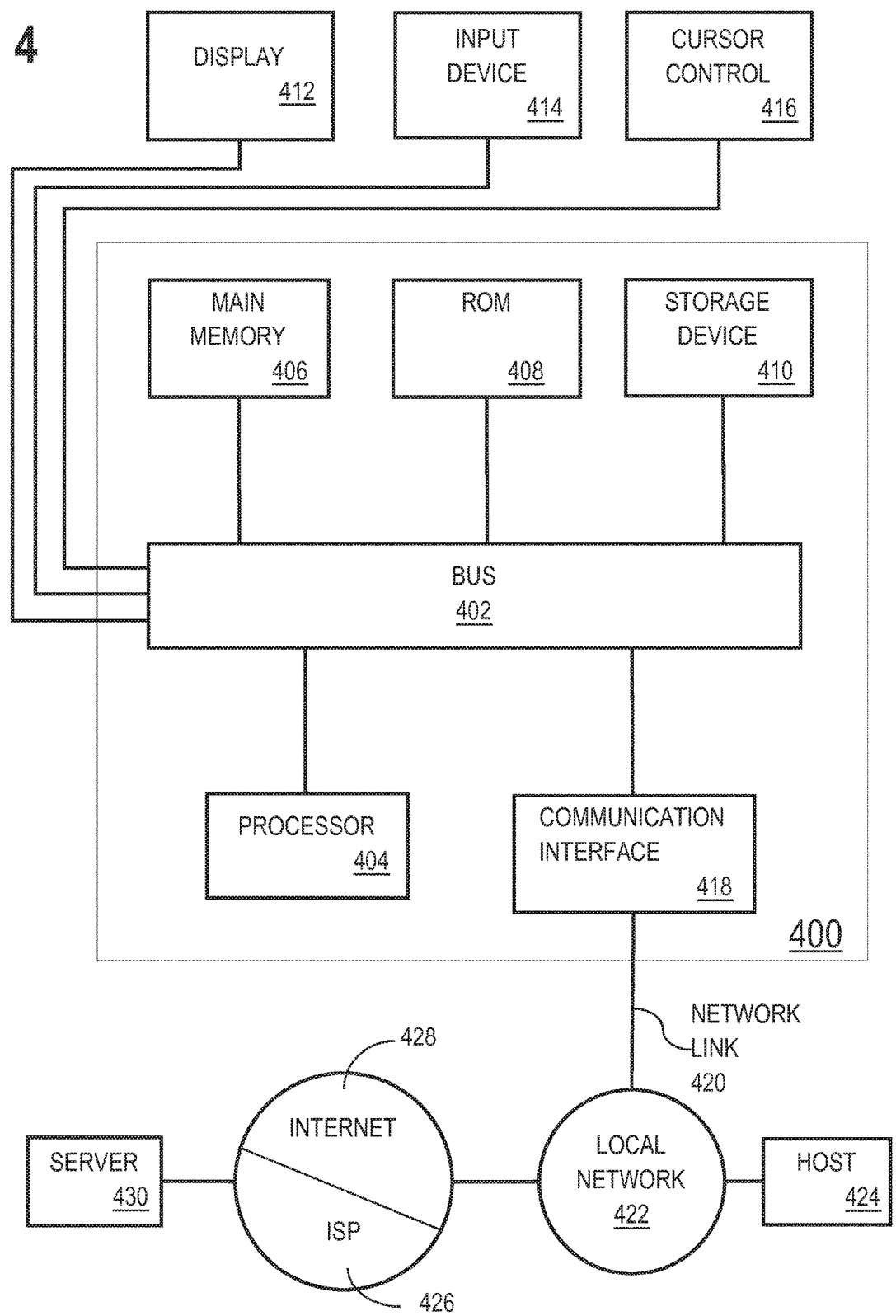
FIG. 4 shows a block diagram that illustrates a computer system in accordance one or more embodiments.

For example, FIG. 4 is a block diagram that illustrates a computer system 400 upon which an embodiment of the invention may be implemented. Computer system 400 includes a bus 402 or other communication mechanism for communicating information, and a hardware processor 404 coupled with bus 402 for processing information. Hardware processor 404 may be, for example, a general purpose microprocessor.

Computer system 400 also includes a main memory 406, such as a random access memory (RAM) or other dynamic storage device, coupled to bus 402 for storing information and instructions to be executed by processor 404. Main memory 406 also may be used for storing temporary variables or other intermediate information during execution of instructions to be executed by processor 404. Such instructions, when stored in non-transitory storage media accessible to processor 404, render computer system 400 into a special-purpose machine that is customized to perform the operations specified in the instructions.

Computer system 400 further includes a read only memory (ROM) 408 or other static storage device coupled to bus 402 for storing static information and instructions for processor 404. A storage device 410, such as a magnetic disk or optical disk, is provided and coupled to bus 402 for storing information and instructions.

Computer system 400 may be coupled via bus 402 to a display 412, such as a cathode ray tube (CRT), for displaying information to a computer user. An input device 414, including alphanumeric and other keys, is coupled to bus 402 for communicating information and command selections to processor 404. Another type of user input device is cursor control 416, such as a mouse, a trackball, or cursor direction keys for communicating direction information and command selections to processor 404 and for controlling cursor movement on display 412. This input device typically has two degrees of freedom in two axes, a first axis (e.g., x) and a second axis (e.g., y), that allows the device to specify positions in a plane.

Computer system 400 may implement the techniques described herein using customized hard-wired logic, one or more ASICs or FPGAs, firmware and/or program logic which in combination with the computer system causes or programs computer system 400 to be a special-purpose machine. According to one embodiment, the techniques herein are performed by computer system 400 in response to processor 404 executing one or more sequences of one or more instructions contained in main memory 406. Such instructions may be read into main memory 406 from another storage medium, such as storage device 410. Execution of the sequences of instructions contained in main memory 406 causes processor 404 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may comprise non-volatile media and/or volatile media. Non-volatile media includes, for example, optical or magnetic disks, such as storage device 410. Volatile media includes dynamic memory, such as main memory 406. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 402. Transmission media can also take the form of acoustic or light waves, such as those generated during radio-wave and infra-red data communications.

Various forms of media may be involved in carrying one or more sequences of one or more instructions to processor 404 for execution. For example, the instructions may initially be carried on a magnetic disk or solid state drive of a remote computer. The remote computer can load the instructions into its dynamic memory and send the instructions over a telephone line using a modem. A modem local to computer system 400 can receive the data on the telephone line and use an infra-red transmitter to convert the data to an infra-red signal. An infra-red detector can receive the data carried in the infra-red signal and appropriate circuitry can place the data on bus 402. Bus 402 carries the data to main memory 406, from which processor 404 retrieves and executes the instructions. The instructions received by main memory 406 may optionally be stored on storage device 410 either before or after execution by processor 404.

Computer system 400 also includes a communication interface 418 coupled to bus 402. Communication interface 418 provides a two-way data communication coupling to a network link 420 that is connected to a local network 422. For example, communication interface 418 may be an integrated services digital network (ISDN) card, cable modem, satellite modem, or a modem to provide a data communication connection to a corresponding type of telephone line. As another example, communication interface 418 may be a local area network (LAN) card to provide a data communication connection to a compatible LAN. Wireless links may also be implemented. In any such implementation, communication interface 418 sends and receives electrical, electromagnetic or optical signals that carry digital data streams representing various types of information.

Network link 420 typically provides data communication through one or more networks to other data devices. For example, network link 420 may provide a connection through local network 422 to a host computer 424 or to data equipment operated by an Internet Service Provider (ISP) 426. ISP 426 in turn provides data communication services through the world wide packet data communication network now commonly referred to as the "Internet" 428. Local network 422 and Internet 428 both use electrical, electromagnetic or optical signals that carry digital data streams. The signals through the various networks and the signals on network link 420 and through communication interface 418, which carry the digital data to and from computer system 400, are example forms of transmission media.

Computer system 400 can send messages and receive data, including program code, through the network(s), network link 420 and communication interface 418. In the Internet example, a server 430 might transmit a requested code for an application program through Internet 428, ISP 426, local network 422 and communication interface 418.

The received code may be executed by processor 404 as it is received, and/or stored in storage device 410, or other non-volatile storage for later execution.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A non-transitory computer readable medium comprising instructions which, when executed by one or more hardware processors, causes performance of operations comprising:
    determining a current operating temperature of a system component within a particular system, wherein the determining operation comprises:
        obtaining a first signal indicating the current operating temperature of the system component detected by a first monitoring device;
        obtaining a second signal indicating a current ambient temperature detected by a second monitoring device;
        responsive to determining that the first signal and the second signal match a particular pattern: determining that the first signal is a valid indication of the current operating temperature of the system component;
    obtaining a maximum operating temperature of the system component;
    computing a difference value between the maximum operating temperature and the current operating temperature;

modifying a parameter of an air-cooling mechanism of an environment, which includes the system component, based on the difference value between the maximum operating temperature and the current operating temperature, wherein the air-cooling mechanism comprises a heating, ventilation, air conditioner (HVAC) system, and the parameter of the air-cooling mechanism comprises a target ambient temperature of the HVAC system.

2. The medium of claim 1, wherein determining that the first signal and the second signal match the particular pattern comprises applying non-linear non-parametric (NLNP) regression.

3. The medium of claim 1, wherein the determining operation further comprises:
mitigating a first quantization effect associated with the first signal.

4. The medium of claim 1, wherein the determining operation further comprises:
mitigating a second quantization effect associated with the second signal.

5. The medium of claim 1, wherein the determining operation further comprises:
synchronizing the first signal and the second signal.

6. The medium of claim 5, wherein synchronizing the first signal and the second signal comprises applying an analytic resampling process.

7. The medium of claim 1, wherein the determining operation further comprises:
mitigating a first quantization effect associated with the first signal;
mitigating a second quantization effect associated with the second signal;
synchronizing (a) the first signal, which is associated with the first quantization effect that has been mitigated, and (b) the second signal, which is associated with the second quantization effect that has been mitigated;
determining that the first signal and the second signal, which have been synchronized, match the particular pattern.

8. The medium of claim 1, wherein the operations further comprise:
identifying a plurality of air-cooling mechanisms associated with one or more environments of the system component;
selecting the air-cooling mechanism, from the plurality of air-cooling mechanisms, for which the parameter of the air-cooling mechanism is to be modified, based on the difference value between the maximum operating temperature and the current operating temperature.

9. The medium of claim 8, wherein the plurality of air-cooling mechanisms comprises: (a) a heating, ventilation, air conditioner (HVAC) system for a room including the particular system; and (b) a fan within the particular system.

10. The medium of claim 1, wherein modifying the parameter of the air-cooling mechanism comprises: determining the target ambient temperature as a function of the difference value between the maximum operating temperature and the current operating temperature.

11. The medium of claim 1, wherein modifying the parameter of the air-cooling mechanism comprises: increasing the target ambient temperature of the HVAC system based on determining that the difference value is above a desired range.

12. The medium of claim 1, wherein modifying the parameter of the air-cooling mechanism comprises: transmitting a control signal to configure the target ambient temperature of the HVAC system.

13. The medium of claim 1, wherein the air-cooling mechanism comprises a fan within the particular system, and the parameter of the air-cooling mechanism comprises a fan speed of the fan.

14. The medium of claim 13, wherein modifying the parameter of the air-cooling mechanism comprises determining the fan speed as a function of the difference value between the maximum operating temperature and the current operating temperature of the system component.

15. The medium of claim 13, wherein modifying the parameter of the air-cooling mechanism comprises: decreasing the fan speed of the fan based on determining that the difference value is above a desired range.

16. The medium of claim 1, wherein the operations further comprise:
computing a plurality of difference values for each system component of a plurality of system components within the particular system, wherein the computing operation comprises:
subtracting (a) a respective current operating temperature of each system component from (b) a respective maximum operating temperature of each system component; and
modifying the parameter of the air-cooling mechanism based on a minimum difference value of the plurality of difference values.

17. The medium of claim 1, wherein the operations further comprise:
mitigating a first quantization effect associated with the first signal;
mitigating a second quantization effect associated with the second signal;
synchronizing (a) the first signal, which is associated with the first quantization effect that has been mitigated, and (b) the second signal, which is associated with the second quantization effect that has been mitigated;
determining that the first signal and the second signal, which have been synchronized, match the particular pattern;
computing a plurality of difference values for each system component of a plurality of system components within the particular system, wherein the computing operation comprises:
subtracting (a) a respective current operating temperature of each system component from (b) a respective maximum operating temperature of each system component;
identifying a minimum difference value of the plurality of difference values;
identifying a plurality of air-cooling mechanisms associated with one or more environments of the system component, the plurality of air-cooling mechanisms comprising: (a) the heating, ventilation, air conditioner (HVAC) system for a room including the particular system; and (b) a fan within the particular system;
selecting the air-cooling mechanism, from the plurality of air-cooling mechanisms, for which the parameter of the air-cooling mechanism is to be modified, based on the minimum difference value; and
increasing a target ambient temperature of the HVAC system based on determining that the minimum difference value is above a desired range.

18. A system, comprising:
at least one device including a hardware processor; and
the system being configured to perform operations comprising:
determining a current operating temperature of a system component within a particular system, wherein the determining operation comprises:
obtaining a first signal indicating the current operating temperature of the system component detected by a first monitoring device;
obtaining a second signal indicating a current ambient temperature detected by a second monitoring device;
responsive to determining that the first signal and the second signal match a particular pattern: determining that the first signal is a valid indication of the current operating temperature of the system component;
obtaining a maximum operating temperature of the system component;
computing a difference value between the maximum operating temperature and the current operating temperature;
modifying a parameter of an air-cooling mechanism of an environment, which includes the system component, based on the difference value between the maximum operating temperature and the current operating temperature, wherein the air-cooling mechanism comprises a heating, ventilation, air conditioner (HVAC) system, and the parameter of the air-cooling mechanism comprises a target ambient temperature of the HVAC system.

19. A method, comprising:
determining a current operating temperature of a system component within a particular system, wherein the determining operation comprises:
obtaining a first signal indicating the current operating temperature of the system component detected by a first monitoring device;
obtaining a second signal indicating a current ambient temperature detected by a second monitoring device;
responsive to determining that the first signal and the second signal match a particular pattern: determining that the first signal is a valid indication of the current operating temperature of the system component;
obtaining a maximum operating temperature of the system component;
computing a difference value between the maximum operating temperature and the current operating temperature;
modifying a parameter of an air-cooling mechanism of an environment, which includes the system component, based on the difference value between the maximum operating temperature and the current operating temperature, wherein the air-cooling mechanism comprises a heating, ventilation, air conditioner (HVAC) system, and the parameter of the air-cooling mechanism comprises a target ambient temperature of the HVAC system;
wherein at least one device including a hardware processor performs the method.

* * * * *

UNITED STATES PATENT AND TRADEMARK OFFICE
CERTIFICATE OF CORRECTION

PATENT NO. : 10,663,991 B2
APPLICATION NO. : 16/115406
DATED : May 26, 2020
INVENTOR(S) : Sondur It is certified that error appears in the above-identified patent and that said Letters Patent is hereby corrected as shown below:

On the Title Page

Column 2, item [56], Line 2, Delete "All-Digitral" and insert -- All-Digital --, therefor.

In the Specification

Column 1, Line 11, delete "issued." and insert -- issued --, therefor.

Column 2, Line 32, after "accordance" insert -- with --.

Column 3, Line 60, after "netbook," insert -- a --.

Column 3, Line 67, delete "in-line" and insert -- In-line --, therefor.

Column 6, Line 65, delete "mechanism(s" and insert -- mechanism(s) --, therefor.

Column 7, Line 27, delete "herein," and insert -- herein. --, therefor.

Column 7, Line 41, delete "e" and insert -- the --, therefor.

Column 8, Line 42, delete "operating," and insert -- operating --, therefor.

Column 8, Line 59, delete "fair" and insert -- for --, therefor.

Column 9, Line 16, delete "overheating," and insert -- overheating --, therefor.

Column 12, Line 45, delete "filed." and insert -- filed --, therefor.

Column 12, Line 51, delete "filed." and insert -- filed --, therefor.

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,663,991 B2

Column 13, Line 51, delete "system, if" and insert -- system. If --, therefor.

Column 15, Line 53, delete "modern." and insert -- modem. --, therefor.